(12) United States Patent
Trimberger

(10) Patent No.: US 7,266,020 B1
(45) Date of Patent: Sep. 4, 2007

(54) METHOD AND APPARATUS FOR ADDRESS AND DATA LINE USAGE IN A MULTIPLE CONTEXT PROGRAMMABLE LOGIC DEVICE

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 269 days.

(21) Appl. No.: 11/184,375

(22) Filed: Jul. 19, 2005

(51) Int. Cl.
*G11C 7/10* (2006.01)

(52) U.S. Cl. .......................... 365/189.02; 365/230.02; 365/230.09

(58) Field of Classification Search ........... 365/189.02, 365/230.02, 230.09
See application file for complete search history.

(56) References Cited

U.S. PATENT DOCUMENTS

| | | | |
|---|---|---|---|
| 5,031,180 A | | 7/1991 | McIver et al. |
| 5,426,378 A | | 6/1995 | Ong |
| 5,646,545 A | | 7/1997 | Trimberger et al. |
| 5,978,260 A | * | 11/1999 | Trimberger et al. ........ 365/182 |
| 6,107,821 A | * | 8/2000 | Kelem et al. ................ 326/38 |
| 6,624,654 B1 | | 9/2003 | Trimberger |
| 6,812,731 B1 | | 11/2004 | Trimberger |
| 7,020,764 B2 | | 3/2006 | Kubota et al. |
| 7,036,059 B1 | | 4/2006 | Carmichael et al. |
| 7,109,752 B1 | | 9/2006 | Schmit et al. |
| 7,111,215 B1 | | 9/2006 | Keller et al. |
| 7,167,025 B1 | | 1/2007 | Schmit et al. |
| 7,167,404 B2 | | 1/2007 | Pathak et al. |
| 7,212,448 B1 | | 5/2007 | Trimberger |
| 2004/0078653 A1 | | 4/2004 | Chan et al. |

OTHER PUBLICATIONS

Xilinx, Inc.: U.S. Appl. No. 11/184,376 by Trimberger filed Jul. 19, 2005.
Xilinx, Inc.; U.S. Appl. No. 11/252,682 by Steiner filed Oct. 18, 2005.

* cited by examiner

*Primary Examiner*—Tuan T. Nguyen
*Assistant Examiner*—Toan Le
(74) *Attorney, Agent, or Firm*—Michael T. Wallace; Lois D. Cartier

(57) ABSTRACT

A method and apparatus to provide triple modular redundancy (TMR) in one mode of operation, while providing multiple context selection during a second mode of operation. Intelligent voting circuitry facilitates both modes of operation, while further enhancing the robustness of the design when used in a TMR mode of operation. Various addressing schemes are provided, which allow dual use of the configuration data lines as selection signals using one addressing scheme, while allowing for dual use of the configuration address lines as selection signals using the second addressing scheme.

20 Claims, 7 Drawing Sheets

METHOD AND APPARATUS FOR ADDRESS AND DATA LINE USAGE IN A MULTIPLE CONTEXT PROGRAMMABLE LOGIC DEVICE

FIELD OF THE INVENTION

The present invention generally relates to programmable logic devices (PLDs), and more particularly to PLDs exhibiting multiple context and high reliability operation.

BACKGROUND

PLDs are a well-known type of integrated circuit that may be programmed to perform specified logic functions. One type of PLD, the Field Programmable Gate Array (FPGA), typically includes an array of programmable tiles. These programmable tiles can include, for example, Input/Output Blocks (IOBs), Configurable Logic Blocks (CLBs), dedicated Random Access Memory Blocks (BRAM), multipliers, Digital Signal Processing blocks (DSPs), processors, clock managers, Delay Lock Loops (DLLs), Multi-Gigabit Transceivers (MGTs) and so forth.

Each programmable tile typically includes both programmable interconnect and programmable logic. The programmable interconnect typically includes a large number of interconnect lines of varying lengths interconnected by Programmable Interconnect Points (PIPs). The programmable logic implements the logic of a user design using programmable elements that may include, for example, function generators, registers, arithmetic logic, and so forth.

The programmable interconnect and the programmable logic are typically programmed by loading a stream of configuration data into internal configuration memory cells that define how the programmable elements are configured. The internal configuration memory cells control configurable points, such as CLB functionality or PIPs. The configuration data may be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to Input/Output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored off-chip in non-volatile memory, then downloaded to volatile memory as part of an initial configuration sequence.

For all of these PLDs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Some PLDs, such as the Xilinx Virtex® FPGA, can be programmed to incorporate blocks with pre-designed functionalities, i.e., "cores". A core can include a predetermined set of configuration bits that program the FPGA to perform one or more functions. Alternatively, a core can include source code or schematics that describe the logic and connectivity of a design. Typical cores can provide, but are not limited to, DSP functions, memories, storage elements, and math functions. Some cores include an optimally floor planned layout targeted to a specific family of FPGAs. Cores can also be parameterizable, i.e., allowing the user to enter parameters to activate or change certain core functionality.

Programmable logic devices can be susceptible to functional failure under certain circumstances. The memory cells, for example, that are used to program the PLD's functionality can inadvertently "flip", or in other words, change their logic state. Such failures may be called single event upsets (SEUs), or radiation induced errors, and can lead to functional failure of the design implemented by the FPGA.

SUMMARY

To overcome limitations in the prior art, and to overcome other limitations that will become apparent upon reading and understanding the present specification, the various embodiments of the present invention disclose an apparatus and method for a programmable logic device that provides multiple configuration memory that supports triple modular redundancy (TMR) as well as providing multiple context operation.

In accordance with one embodiment of the invention, a multiple context memory cell is provided within a programmable logic device (PLD). The multiple context memory cell comprises a first pass gate that is coupled to receive a first data bit and is adapted to pass the first data bit in response to a first address signal. The multiple context memory cell further comprises a second pass gate that is coupled to receive the first data bit from the first pass gate and is adapted to pass the first data bit in response to a configuration enable signal. The multiple context memory cell further comprises a first latch that is coupled to receive the first data bit from the second pass gate and is adapted to store the first data bit. The multiple context memory cell further comprises a first multiplexer that is coupled to the first latch and is adapted to provide the first data bit as a first output of the multiple context memory cell in response to a first level of the first address signal and is further adapted to provide a second data bit as the first output of the multiple context memory cell in response to a second level of the first address signal.

In accordance with another embodiment of the invention, a method of implementing a multiple context addressing scheme within a programmable logic device (PLD) comprises allocating multiple context definitions within a configuration array, assigning a data line to each bit of each context definition, programming a data value for each bit of each context definition by using the assigned data line for each bit programmed, and selecting one of the context definitions to define a logic function within the PLD in response to a configuration select signal, where the configuration select signal utilizes the assigned data line.

In accordance with another embodiment of the invention, a method of implementing a multiple context addressing scheme within a programmable logic device (PLD) comprises allocating multiple context definitions within a configuration array, assigning an address line to each memory cell of each context definition, programming a data value for each memory cell by activating the memory cell using the address line, and selecting one of the multiple context definitions to define a logic function within the PLD in response to a configuration select signal, where the configuration select signal utilizes the assigned address line.

BRIEF DESCRIPTION OF THE DRAWINGS

Various aspects and advantages of the invention will become apparent upon review of the following detailed description and upon reference to the drawings in which.

DETAILED DESCRIPTION

Generally, the various embodiments of the present invention provide a method and apparatus to provide triple modular redundancy (TMR) in one mode of operation, while providing multiple context selection during a second mode of operation. Intelligent voting circuitry facilitates both modes of operation, while enhancing the robustness of the design when used in a TMR mode of operation. Various addressing schemes are provided, which allow dual use of the configuration data lines as configuration selection signals with a first addressing scheme, while allowing for dual use of the configuration address lines as configuration selection signals using with a second addressing scheme.

Figure 1:
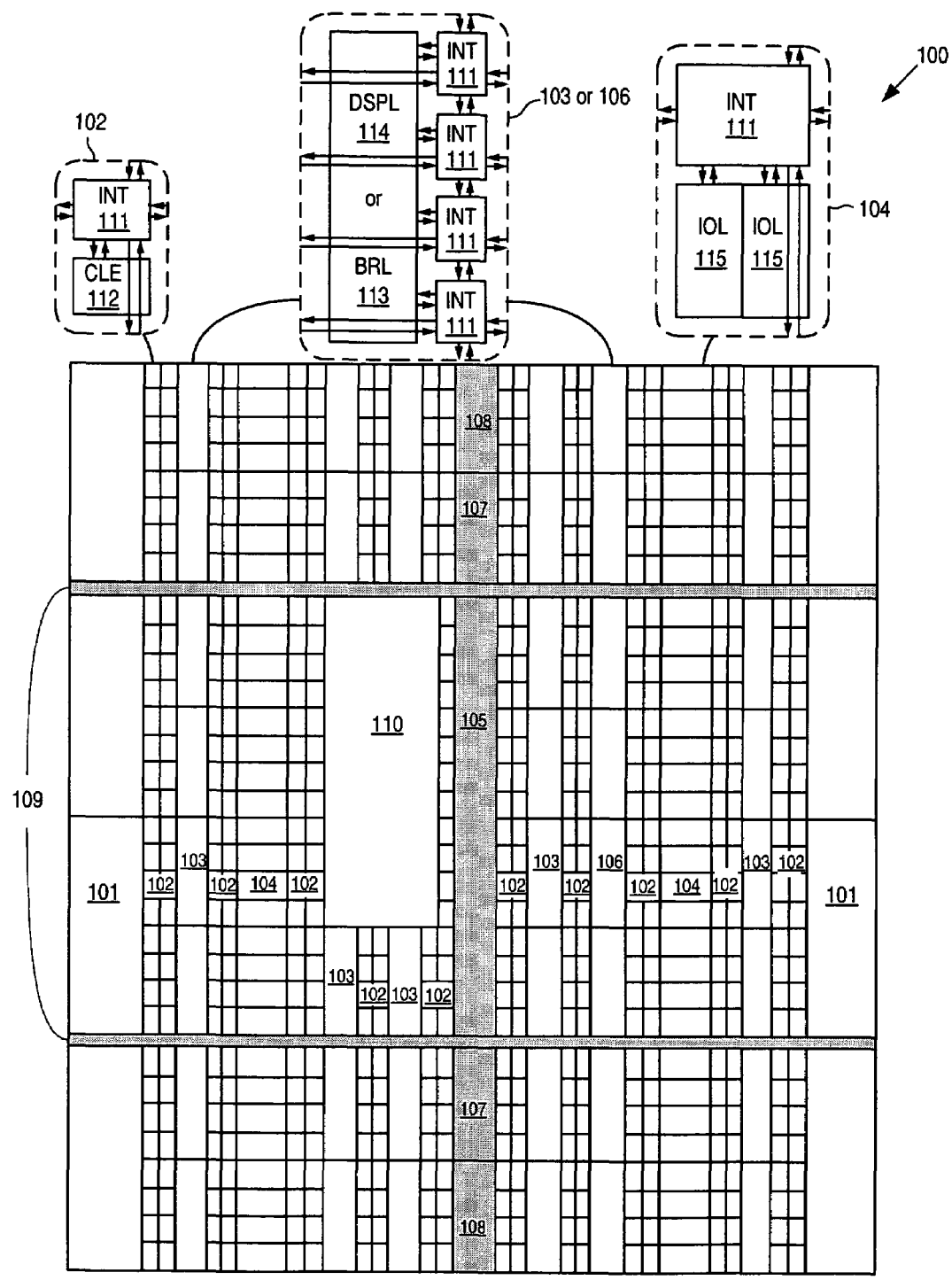
FIG. 1 illustrates an integrated circuit (IC) that exemplifies a Field Programmable Gate Array (FPGA) architecture.

As noted above, advanced integrated circuits (ICs), such as FPGAs, can include several different types of programmable logic blocks in the array. For example, FIG. 1 illustrates an IC that exemplifies FPGA architecture 100, including a large number of different programmable tiles such as Multi-Gigabit Transceivers (MGTs) 101, CLBs 102, BRAMs 103, IOBs 104, configuration and clocking logic CONFIG/CLOCKS 105, DSPs 106, specialized I/O 107, including configuration ports and clock ports, and other programmable logic 108, such as digital clock managers, analog-to-digital converters, system monitoring logic, and so forth. Some FPGAs also include dedicated processor blocks PROC 110, in which specific CPU related functionality may be utilized that is separate from the FPGA fabric.

In some FPGAs, each programmable tile includes programmable interconnect element INT 111 having standardized connections to and from a corresponding interconnect element in each adjacent tile. Therefore, the programmable interconnect elements taken together implement the programmable interconnect structure for the illustrated FPGA. INT 111 also includes the connections to and from the programmable logic element within the same tile, as shown by the examples of blocks 102 and 104.

For example, a CLB 102 may include a Configurable Logic Element CLE 112 that may be programmed to implement user logic plus a single programmable interconnect element INT 111. A BRAM 103 can include a BRAM logic element (BRL 113) in addition to one or more programmable interconnect elements. Typically, the number of interconnect elements included in a tile depends on the height of the tile.

In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 may include, for example, two instances of an input/output logic element IOL 115 in addition to one instance of the programmable interconnect element INT 111.

As will be clear to those of skill in the art, the actual I/O pads connected, for example, to the I/O logic element 115 are manufactured using metal layers above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 may span several columns of CLBs and BRAMs.

Note that FIG. 1 is intended to illustrate only an exemplary FPGA architecture. The number of logic blocks in a column, the relative width of the columns, the number and order of columns, the type of logic blocks included in the columns, the relative size of the logic blocks, and the interconnect/logic implementations 102, 103, and 104 are purely exemplary. For example, in an actual FPGA more than one adjacent column of CLBs is typically included wherever the CLBs appear, to facilitate the efficient implementation of user logic.

As discussed above, configuration of a PLD may be performed via static latch memory cells that store control data, where each memory cell stores a single bit of control data. The control data may be used to control the conductivity state of pass transistors in multiplexers, to serve as logic values in lookup tables, or to perform some other configuration function. The control data bits can be stored in volatile memory (e.g., static memory cells, as in FPGAs and some CPLDs), in non-volatile memory (e.g., FLASH memory, as in some CPLDs), or in any other type of memory cell. In various embodiments of the invention, the control data bits may be organized into various configuration memory blocks and appropriately accessed to support both a TMR and a multiple context mode of operation.

Figure 2:
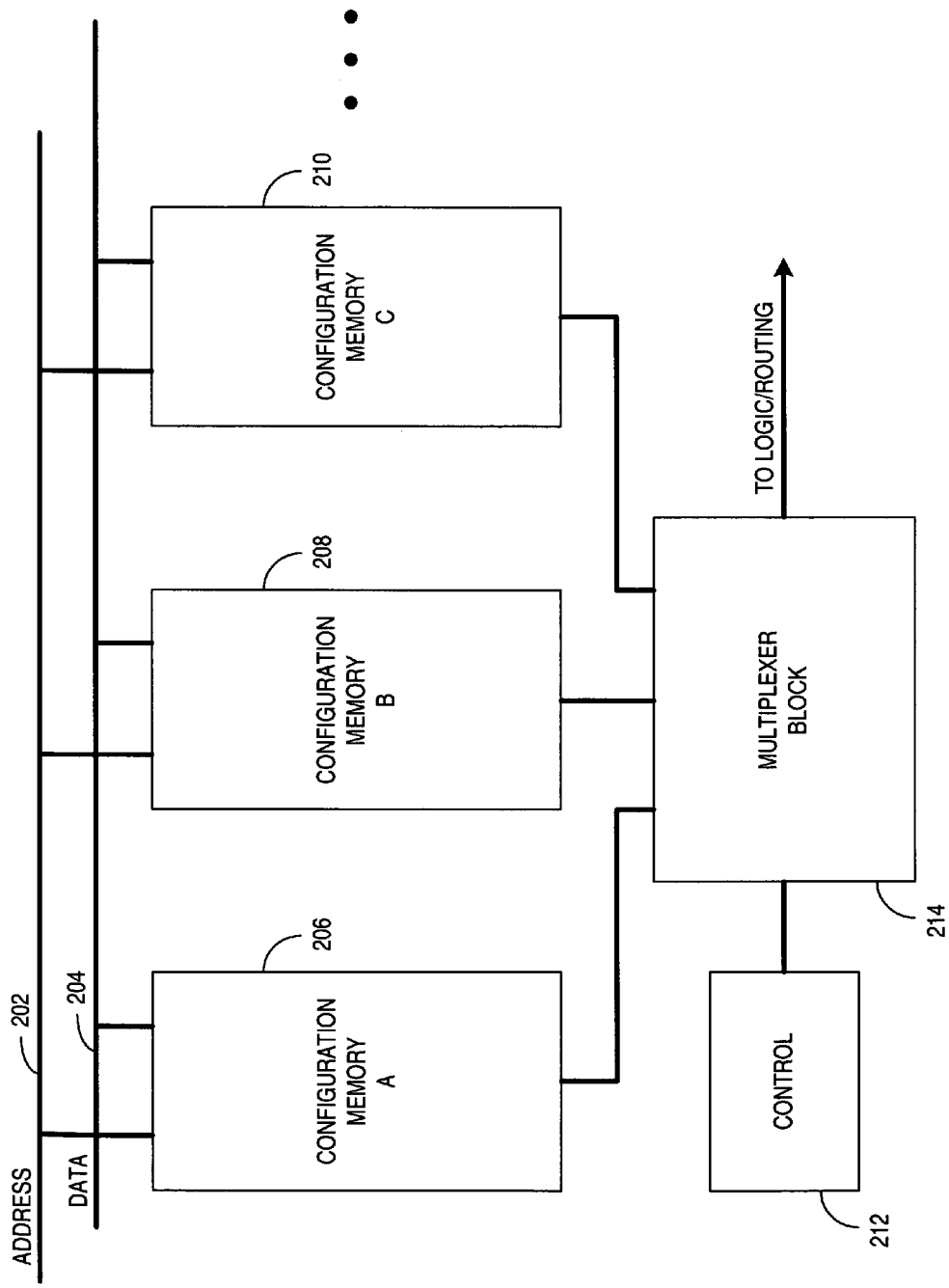
FIG. 2 illustrates an exemplary configuration memory block diagram in accordance with one embodiment of the present invention.

Turning to FIG. 2, configuration block diagram 200 in accordance with one embodiment of the present invention is exemplified. Configuration memory blocks 206-210 represent a portion of configuration memory blocks that may be present within a PLD, such as FPGA 100 of FIG. 1, or a CPLD, to control logic and routing of a configurable function within the PLD. Configuration memory blocks 206-210 may co-exist within the same configuration memory array, or may exist in separate configuration memory arrays.

Address bus 202 and data bus 204 combine to provide configuration memory data frames to configuration memory blocks 206-210. For each address applied to configuration memory blocks 206-210 by address bus 202, data bits from data bus 204, i.e., one data frame, may be written into the corresponding memory cells of configuration memory blocks 206-210.

In accordance with one embodiment of the present invention, each data frame written into configuration memory blocks 206-210 are identical. Thus, once configuration memory blocks 206-210 have been programmed, each configuration memory block 206-210 contains contents that are identical. It should be noted, that while three configuration memory blocks are illustrated, other quantities of memory blocks, such as 5, 7, 9, etc. may be provided. As discussed in more detail below, the same configuration data is written into an odd number of configuration memory blocks, when implementation of a high reliability mode of operation is desired.

In an alternative embodiment, configuration memory blocks 206-210 may contain different data. In such an instance, each of configuration memories 206-210 may contain configuration memory that defines a completely different logic and routing configuration, i.e., context, of the PLD. Thus, through selection of configuration memory 206, for example, the PLD may be configured as an operational component to support recording within a video recording device, whereas if configuration memory 208 is selected, the PLD may be configured to operate as an operational component to support video playback within the same video device.

Through operation of control block 212 and multiplexer block 214, either a high-reliability mode of operation, or a multiple context mode of operation is provided. In the high-reliability mode of operation, configuration memory blocks 206-210 are written with identical contents. Voting circuitry distributed between control block 212 and multiplexer block 214 ensures that correct configuration data is provided for correct logic/routing definitions by selecting configuration data that conforms to a majority rule.

That is to say, for example, that should any of the memory cell locations within either of configuration memory blocks 206-210 be contaminated, e.g., through operation of a single event upset, then voting circuitry within control block 212 and multiplexer block 214 detects the disparity between the memory cells' contents. In particular, the voting circuitry compares the contaminated memory cell's contents with the redundant memory cells' contents, and selects the correct logic value in accordance with the majority rule. Thus, if the logic values for three memory cells are, for example, "1", "1", "0", then the voting circuitry selects a "1" to be the correct state of the configuration bit, which is then used to control the configurable point in the logic or routing. In general, given that an odd number of memory cells are analyzed by the voting circuitry, a majority condition should always exist to provide a valid majority rule comparison.

If, on the other hand, the contents of configuration memory blocks 206-210 are different, then a multiple context mode of operation is desired. In this instance, control block 212 and multiplexer block 214 simply interoperate to provide the correct configuration, e.g., one of configuration memory A, B, C, etc. to implement the desired logic and routing for the configurable function of the PLD.

It can be seen, therefore, that while one embodiment of the present invention provides the ability for a high-reliability mode of operation, an alternative mode of operation, i.e., multiple context configuration ability, is also provided in another embodiment of the present invention. In such an instance, should the user of the PLD decide not to use the high reliability mode, he/she may instead choose to utilize the configuration memory blocks for alternate configurations. Configurations of the PLD may be altered within a single clock cycle as will be discussed in more detail below.

Figure 3:
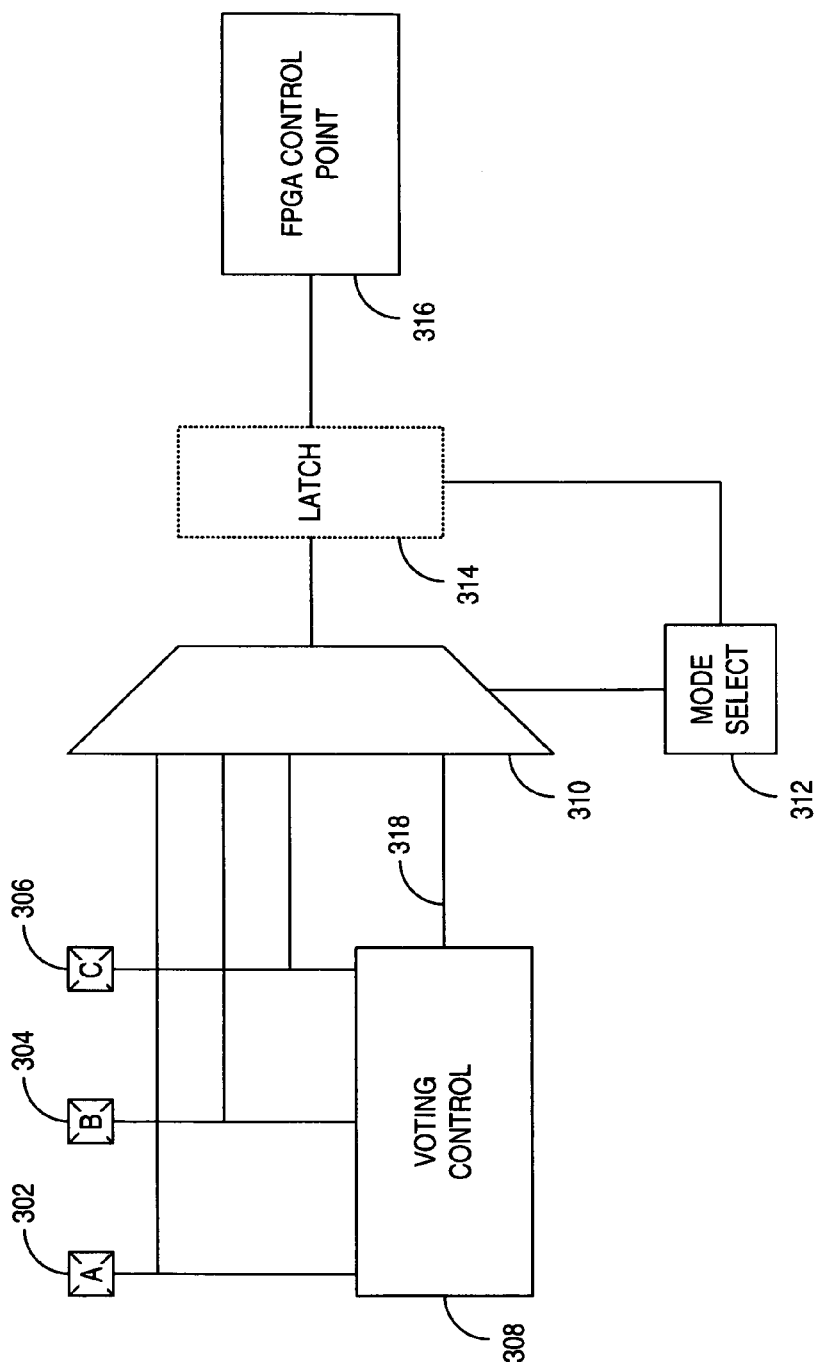
FIG. 3 illustrates a voting control circuit in accordance with one embodiment of the present invention.

Turning to FIG. 3, a voter/multiplexer control circuit in accordance with one embodiment of the present invention is exemplified. In this embodiment, a three memory cell implementation is illustrated, in which memory cells 302-306 represent individual memory cells of corresponding first, second, and third configuration memory blocks as shown, for example, by configuration memory blocks 206-210 of FIG. 2.

In particular, memory cell 302 may exist within configuration memory block 206, memory cell 304 may exist in configuration memory block 208, and memory cell 306 may exist in configuration memory block 210. As discussed above, memory cells 302-306 may represent 3 bits of individual contexts, 302, 304, and 306, for a multiple context mode of operation. Conversely, memory cells 302-306 may represent 3 bits initially having identical values, such as is the case in a high-reliability, e.g., TMR mode of operation.

While in a multiple context mode of operation, mode select 312 is effective to select one of inputs A-C, which corresponds to memory cells 302-306, respectively, via multiplexer 310. As such, the logic value of the selected memory cell is optionally latched by latch 314 and ultimately provided to FPGA control point 316. FPGA control point 316 is then operative to effect logic and/or routing within the FPGA in accordance with the function that is associated with the logic value of FPGA control point 316.

Alternatively, while in a high reliability mode of operation, mode select 312 selects input 318 to be supplied to optional latch 314. In this instance, voting control circuit 308 receives the logic values of memory cells 302-306 and determines which logic value represents the majority of logic values contained within memory cells 302-306. The truth table of the operation of voting control circuit 308 is illustrated in Table 1. The Boolean function of equation (1) as implemented by voting control circuit 308 is, for example, $$D = A\&B | B\&C | C\&A, \quad (1)$$

where D is the logic value of voting control circuit output 318, A is the logic value contained within memory cell 302, B is the logic value contained within memory cell 304, C is the logic value contained within memory cell 306, "&" is the logical AND operator, and "|" is the logical OR operator.

TABLE 1

| CELL A | CELL B | CELL C | VOTER OUTPUT |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

Thus, given a majority number of logic low valued memory cells, i.e., 2 or more out of 3, an output logic value of "0" will be selected by voting control circuit 308 as output 318. On the other hand, given a majority of logic high valued memory cells, i.e., 2 or more out of 3, an output logic value of "1" will be selected by voting control circuit 308 as output 318.

It should be noted that latch 314 is an optional component of FIG. 3. In particular, removing latch 314 would provide one less component in the signal path between multiplexer 310 and FPGA control point 316. Removing latch 314 may be advantageous, therefore, during a high-reliability mode of operation, since by removing latch 314, one less component exists in the signal path that may contribute to a single event upset.

On the other hand, providing latch 314 in the signal path between multiplexer 310 and FPGA control point 316 facilitates a multiple context mode of operation. In particular, while FPGA control point 316 is at a logic level equivalent to the logic level of memory cell 302, for example, mode select 312 may flip the selection state of multiplexer 310 to select the logic level of either memory cell B 304 or C 306, depending upon the context change that is desired. Once the logic value of memory cell 304 or 306 is provided to the input of latch 314, mode select 312 may then activate latch 314 to provide the logic value of memory cell 304 or 306 to FPGA control point 316. In this way, transition from one context to another may occur synchronously through operation of latch 314.

It should be noted, that while FIG. 3 illustrates activation of one memory cell from a selection of three memory cells, a plurality of memory cells may be similarly selected. When one of memory cells 302-306, for example, are selected, many hundreds to many tens of thousands of other memory cells may be similarly selected at corresponding FPGA control points to implement a particular design. In such an instance, therefore, inputs A-C of multiplexer 310 may each represent a different logic/routing configuration for three separate designs.

Through operation of latch 314, the FPGA is then able to toggle its mode of operation at every rising or falling edge of its latch signal received from mode select 312. That is to say, for example, that while the FPGA may be operating in accordance with a user design represented by the "A" memory cells, the user may select a design represented by the "B" memory cells, such that the logic level of the "B" memory cells is made available at the input of latch 314. Upon activation of the trigger signal from mode select 312, the new design represented by the "B" memory cells is then activated within the FPGA and the FPGA functions in accordance with the "B" design.

Figure 4:
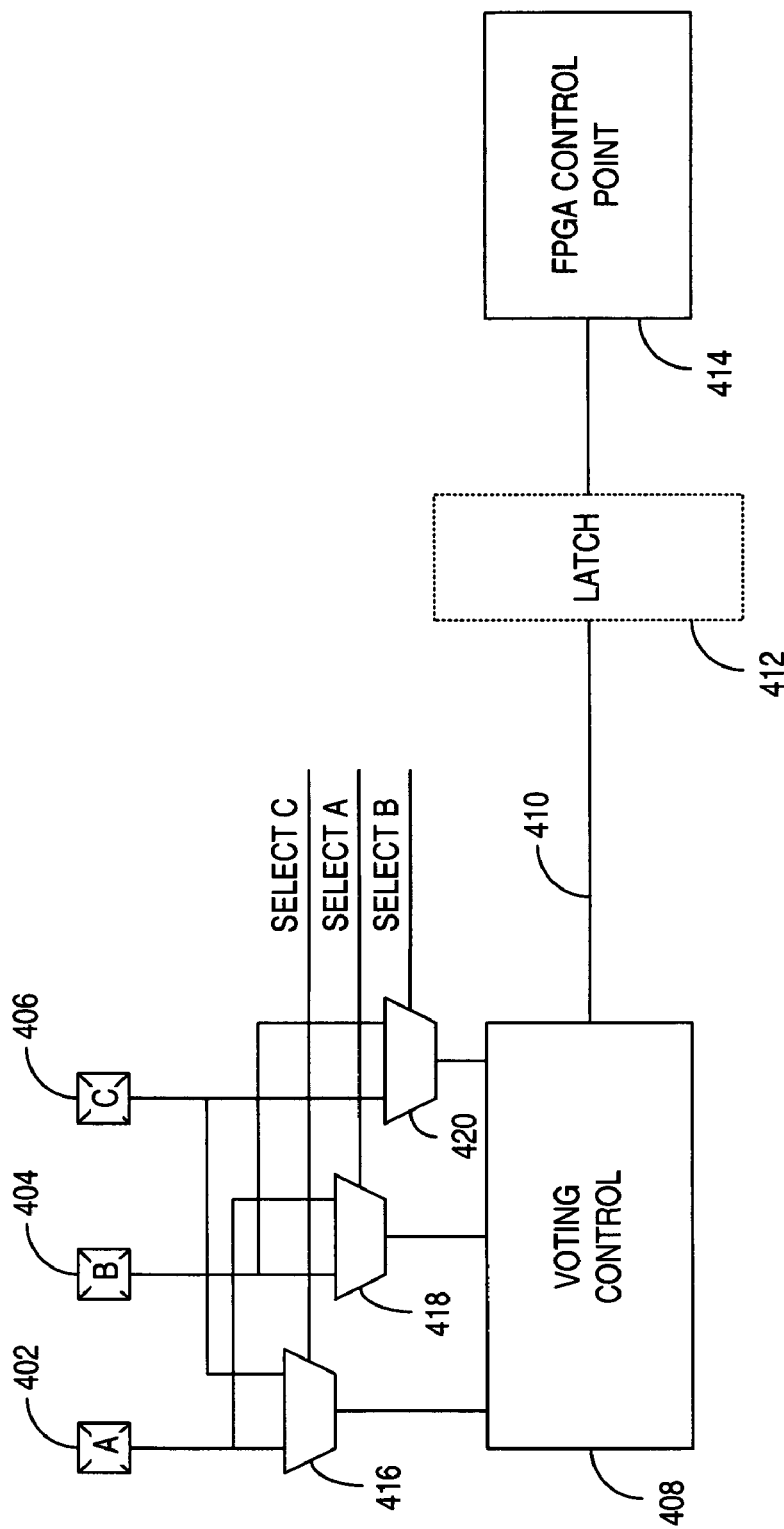
FIG. 4 illustrates an alternative voting control circuit in accordance with another embodiment of the present invention.

Turning to FIG. 4, an alternative voter/multiplexer control circuit is exemplified in accordance with another embodiment of the present invention. It can be seen by inspection, that 4-to-1 multiplexer 310 as illustrated by FIG. 3 is removed. Thus, instead of requiring a multiplexer to select which of memory cells A 402, B 404, or C 406 is to be activated, the selection circuit of FIG. 4 instead biases the input to voting control circuit 408 to force the desired selection.

Control signals SELECT A, SELECT B, and SELECT C are each mutually exclusive logic controls that have been previously decoded into logic high, i.e., "True", or logic low, i.e., "False", logic levels. In addition, the inputs to 2-to-1 multiplexers 416-420 are cross-connected in an appropriate fashion, such that when combined with the SELECT A, SELECT B, and SELECT C control signals, their respective output logic levels are effective to create the required bias condition.

In operation, voting control circuit 408 implements equation (1) as discussed above when determining which memory cell is to be activated at FPGA control point 414. Control signals SELECT A, SELECT B, and SELECT C are each used to toggle the selection decision performed by multiplexers 416-420. Appropriately selected, the control signals are effective to duplicate a particular input to voting control circuit 408 so as to bias its voting decision.

For example, when control signal, SELECT A, is at a logic high level, each of control signals SELECT B and SELECT C are at a logic low level. Thus, multiplexer 416 selects its first input, memory cell A 402, as its output, multiplexer 418 selects its second input, memory cell A 402 as its output, and multiplexer 420 selects its first input, memory cell C 406 as its output. The three inputs to voting control circuit 408 are, therefore, "A", "A", "C", thus requiring that the logic level of memory cell A 402 be placed at output 410 by operation of the majority rule of equation (1).

Similarly, when control signal, SELECT B, is at a logic high level, each of control signals SELECT A and SELECT C are at a logic low level. Thus, multiplexer 416 selects its first input, memory cell A 402, as its output, multiplexer 418 selects its first input, memory cell B 404 as its output, and multiplexer 420 selects its second input, memory cell B 404 as its output. The three inputs to voting control circuit 408 are, therefore, "A", "B", "B", thus requiring that the logic level of memory cell B 404 be placed at output 410 by operation of the majority rule of equation (1).

Similarly, when control signal, SELECT C, is at a logic high level, each of control signals SELECT A and SELECT B are at a logic low level. Thus, multiplexer 416 selects its second input, memory cell C 406, as its output, multiplexer 418 selects its first input, memory cell B 404 as its output, and multiplexer 420 selects its first input, memory cell C 406 as its output. The three inputs to voting control circuit 408 are, therefore, "C", "B", "C", thus requiring that the logic level of memory cell C 406 be placed at output 410 by operation of the majority rule of equation (1).

Thus, by asserting one of control signals SELECT A, SELECT B, or SELECT C, a multiple context mode of operation may be established. Through the use of latch 412 and associated control input (not shown), a synchronous context change in the FPGA may be effected. In such an instance, the correct context may first be selected through operation of multiplexers 416-420 and voting control circuit 408 as discussed above. Next, once the correct context is selected, it may then be latched into FPGA control point 414.

It should be noted, that if optional latch 412 is removed, the entire signal path from voting control circuit 408 and FPGA control point 414 is completely void of programmable logic. Thus, by removing latch 412, signal path 410 may made to be less susceptible to single event upset.

In an alternative embodiment, a glitchless transition from one context to another is achieved through appropriate control of select signals SELECT A, SELECT B, or SELECT C. A glitchless transition guarantees that if A and B are the same value, that the output does not temporarily take on some different value. In particular, a two-step transition process is provided, which guarantees that all three inputs to voting control circuit 408 are not the same.

For example, given that the current context is "A" and a context transition to "B" is desired, then the two-step transition illustrated in Table 2 is effective to ensure a glitchless transition from context "A" to "B".

TABLE 2

| OPERATION | INPUT #1 | INPUT #2 | INPUT #3 | VOTER OUTPUT |
|---|---|---|---|---|
| select A | A | A | C | A |
| select A and B | A | A | B | A |
| deselect A and select B | A | B | B | B |

In particular, the process begins with the "A" context having been selected, where as discussed above, inputs #1, #2, and #3 into voting control circuit 408 are "A", "A", and "C", respectively, through appropriate selection of signals SELECT A, SELECT B, and SELECT C. Next, both SELECT A and SELECT B are asserted to a logic high value and signal SELECT C remains deasserted at a logic low value. As such, the first input of multiplexer 416, memory cell A 402, and the second inputs of multiplexers 418 and 420, memory cells A and B, are applied to the input of voting control circuit 408 to provide the logic value of memory cell A at output 410 as shown in Table 2.

Next, SELECT A is deasserted to a logic low value and SELECT B remains asserted to a logic high value. As such, the first input of multiplexer 416, memory cell A 402, the first input of multiplexer 418, memory cell B 404, and the second input of multiplexer 420, memory cell B, are applied to the input of voting control circuit 408 to provide the logic value of memory cell B at output 410 as shown in Table 2. Thus, it can be seen that a glitchless transition between contexts "A" and "B" is facilitated.

A voter control circuit as illustrated, for example, in FIG. 4 is applied to each set of three configuration memory cells for either of TMR, or multiple context, modes of operation. It can be seen, therefore, that a substantial number of select lines is required to facilitate configuration changes for either mode.

Note that the circuit of FIG. 4 (e.g., including elements 408, 416, 418, and 420) can be used in systems and circuits other than multiple context PLDs. For example, this circuit can be used in any application where it is desired to select between two modes of operation, TMR and an identity function. In a first mode, the circuit would apply TMR to the three input data signals (A, B, and C) from the three signal sources (e.g., memory cells 402, 404, and 406). In a second mode, the circuit would select one of the input data signals from one of the three signal sources, and apply the selected input data signal to two of the three input terminals of voting circuit 408. Therefore, because the voting circuit implements a majority vote of the input signals, the selected one of the input data signals would appear at the output terminal of the voting circuit. The second mode could be used, for example, as a test mode in which each of the three input data signals is provided in turn to the output terminal of the voting circuit.

Figure 5:
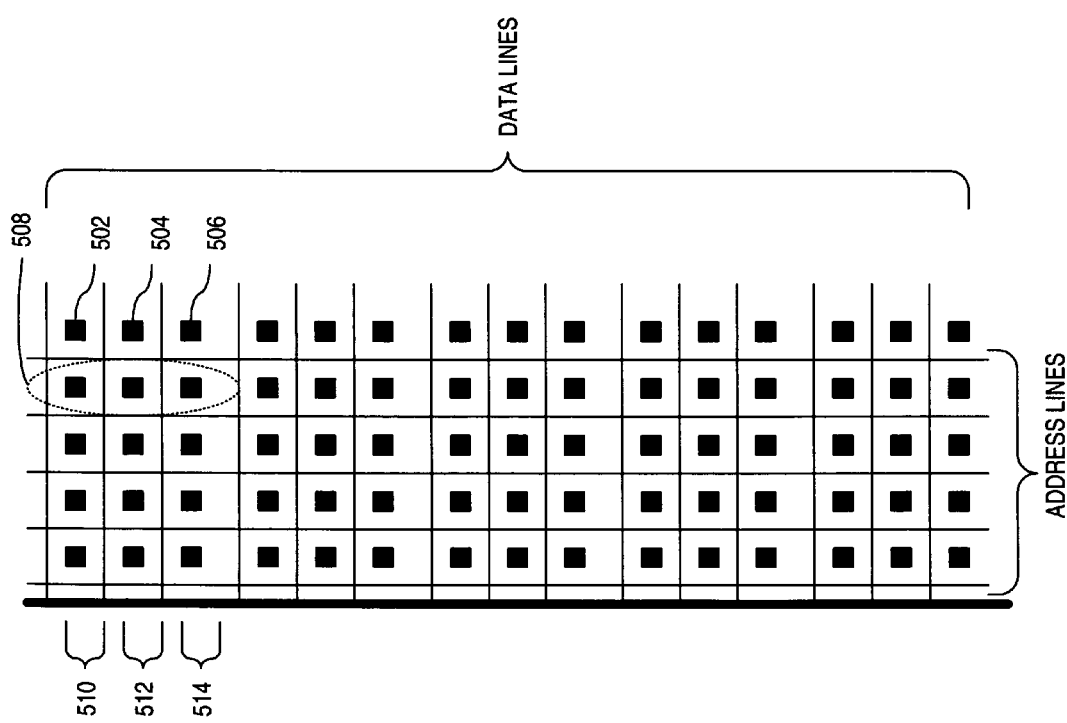
FIG. 5 illustrates a configuration memory in accordance with one embodiment of the present invention.

In one embodiment according to the present invention, each configuration frame is increased in size by a factor of three bits to provide for the additional configuration memory cells as exemplified in FIG. 5. In particular, address lines are illustrated to run vertically and bit lines are illustrated to run horizontally, where in the illustrated embodiment, a total of 5 frames are shown. It should be noted, however, that virtually any number of frames may be supported by the various embodiments of the present invention and the discussions herein are presented merely for instructional purposes only.

In one embodiment, the organization of data frames is chosen so that multiple bits in a single frame store A, B and C values for a single programming point. Bit 502, for example, represents the "A" copy of the $0^{th}$ configuration bit. Similarly, bits 504 and 506 represent, for example, the "B" and the "C" copies of the $0^{th}$ configuration bits. Thus, bits 502-506 may be used, for example, to initially program the logic values of memory cells 302-306 as illustrated in FIG. 3, or memory cells 402-406 as illustrated in FIG. 4. The three bits below bit 506 represent another programming point, for example, the $1^{st}$ configuration bits of the configuration frame. Similarly, data bits 508 may represent the A, B, and C copies of the $0^{th}$ configuration bits of the next configuration frame, and so on. Thus, data bit group 510 represents the first 5-bits of data for the "A" configuration, data bit group 512 represents the first 5-bits of data for the "B" configuration, and data bit group 514 represents the first 5-bits of data for the "C" configuration.

After all memory cells have been configured by the configuration data as exemplified in FIG. 5, then the data lines, e.g., 502-506, used to program the memory cells are available for other use. That is to say, that if the address lines of FIG. 5 are not activated for configuration, then the data lines are unused and are free to be used in another capacity. Thus, the data lines may also be used as the configuration selection lines, SELECT A, SELECT B, and SELECT C as illustrated in FIG. 4.

After configuration, therefore, data line 502 selects "A" for the $0^{th}$ configuration bit, SELECT $A_0$, data line 504 selects "B" for the $0^{th}$ configuration bit, SELECT $B_0$, and data line 506 selects "C" for the $0^{th}$ configuration bit, SELECT $C_0$. In such a way, the need to run separate select lines for each selection circuit is obviated through the dual use of data lines as provided by one embodiment of the present invention.

In an alternative embodiment, the multiple bits corresponding to the same configuration point are stored in identical bit locations in sequential frames. The configuration controller may address configuration frames sequentially according to a multi-frame write capability as exemplified in FIG. 6. Multi-frame write capability is especially convenient during a TMR mode configuration, since the same data is being written for each configuration. In this instance, data lines 602, 610, 612, 614, and 616 represent, for example, data bits $A_0$-$A_4$ of the first word of the "A" configuration that is addressed by address, X, for example. The address may then be incremented to X+1 and the same data word may be written again starting with data line 604, which represents data bit, $B_0$, of the first word of the "B" configuration. The other data bits, $B_1$-$B_4$, are offset from data bit $B_0$ in the same fashion as data bits $A_1$-$A_4$ are offset from $A_0$. The address may again be incremented to X+2 and the same data word may again be written to the first word of the "C" configuration.

Thus, it can be seen that the data word only needs to be transmitted once and then can be subsequently written into 3 continuous address locations, X, X+1, and X+2, before a new data word is to be transmitted. Bits 608, for example, may represent the 1st bit of the first word for each configuration, i.e., $A_1$, $B_1$, and $C_1$, which only needed to be transmitted one time in order to update three separate memory cells.

Figure 6:
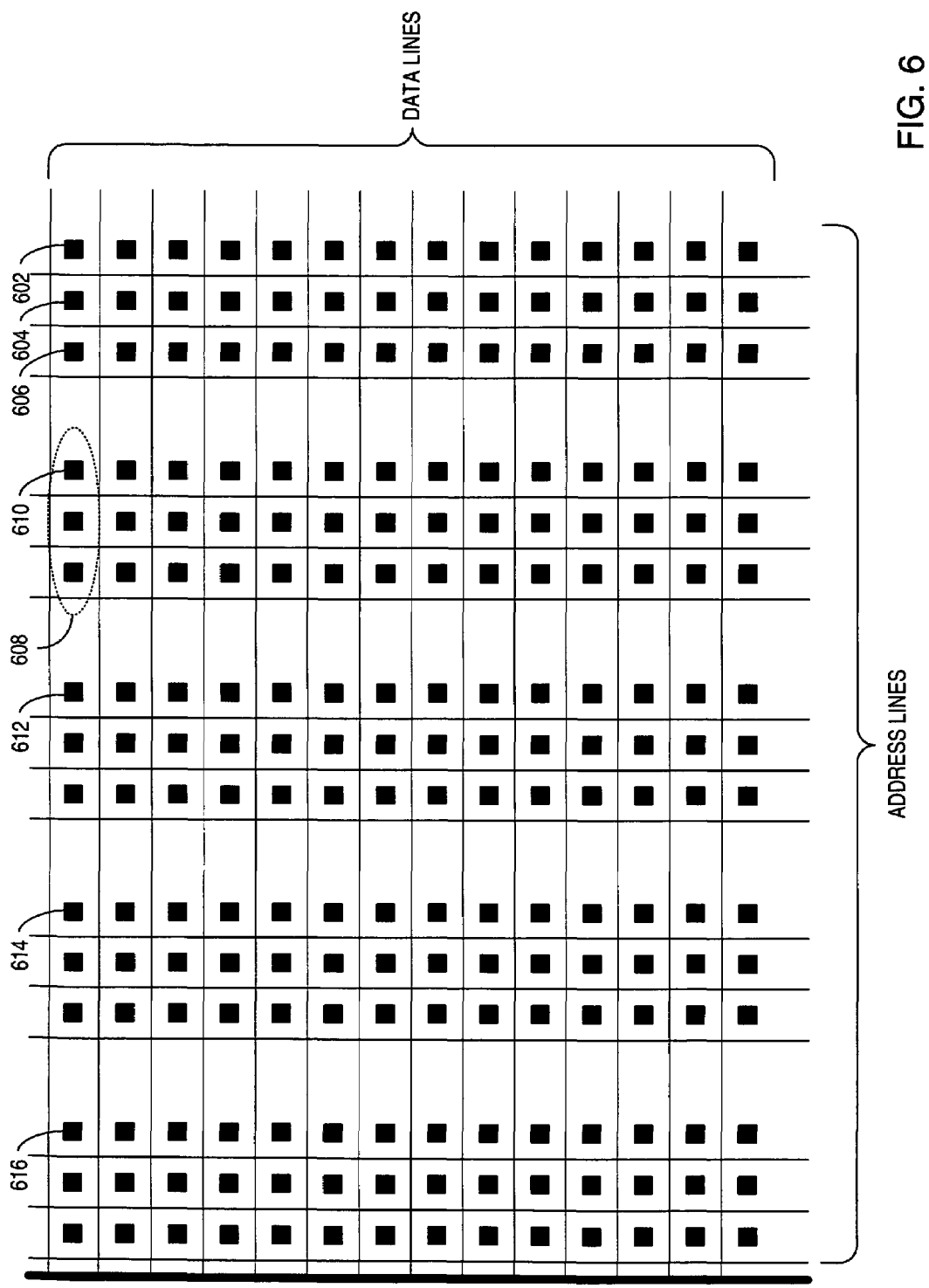
FIG. 6 illustrates an alternative configuration memory in accordance with another embodiment of the present invention.

In an alternative embodiment, multiple context configurations are also supported by the configuration diagram of FIG. 6. In particular, the configuration controller may write each data frame of a particular configuration before writing the data frames of another configuration. In such an instance, the data frames of configuration "A" are written in discontinuous fashion by incrementing the write addresses using integer offsets, e.g., X, X+3, X+6, etc. Similarly, the data frames of configuration "B" are written in discontinuous fashion by incrementing the write addresses using integer offsets, e.g., X+1, X+4, X+7, etc. Thus, all frames of a particular configuration, "A", "B", or "C", may be configured before moving on to all of the frames of another configuration.

Figure 7:
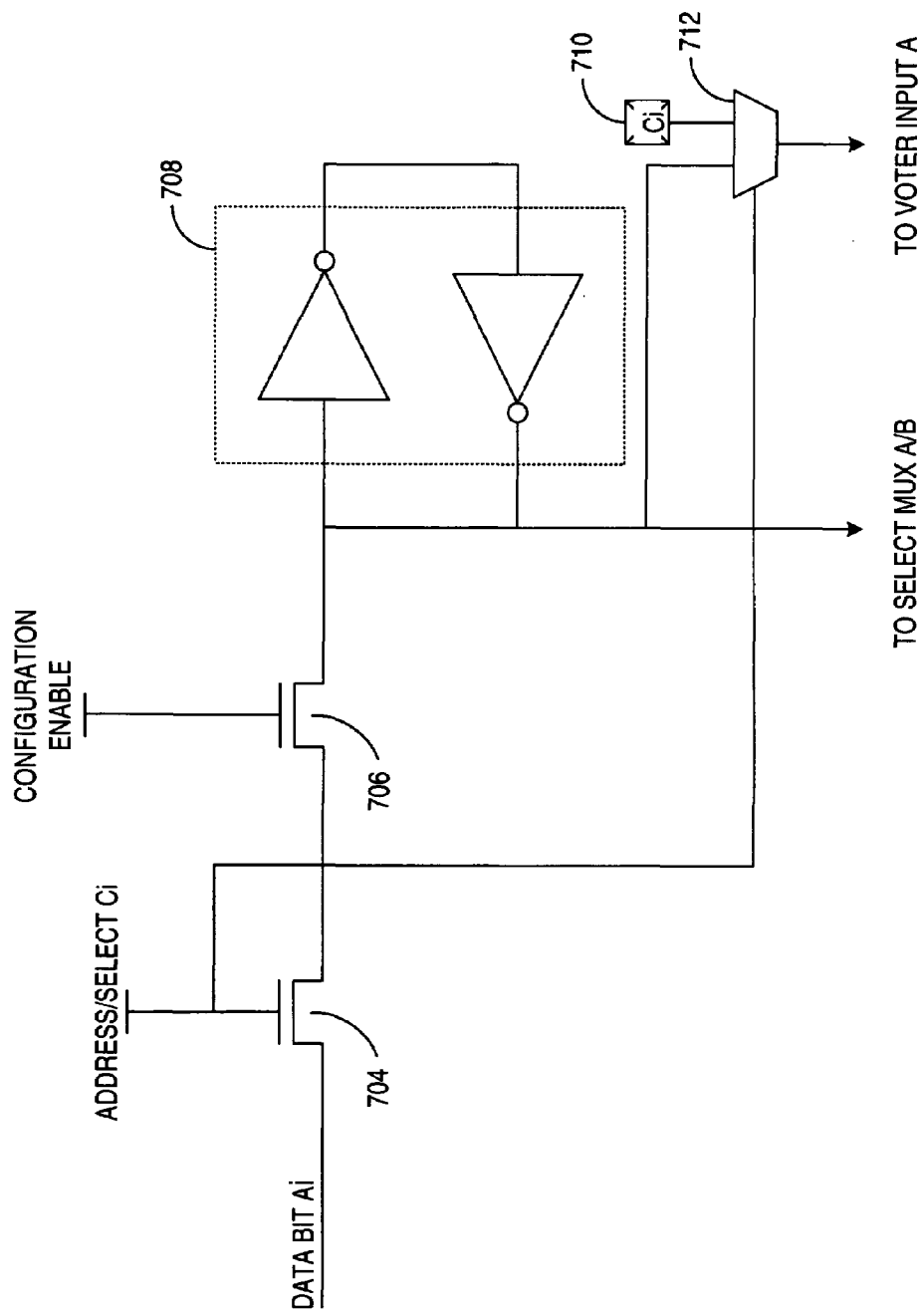
FIG. 7 illustrates an exemplary memory cell in accordance with one embodiment of the present invention.

In order to utilize the addressing scheme of FIG. 6, the alternative memory cell configuration of FIG. 7 may be utilized, where multiplexer 712 corresponds to multiplexer 416 of FIG. 4 and memory cell C 710 corresponds to memory cell C 406 of FIG. 4. Cross-coupled inverters 708 represent memory cell A 402 of FIG. 4. Two pass gates exist for the alternative memory cell of FIG. 7, where pass gate 706 is used to enable a global configuration state of the FPGA.

In operation, signal CONFIGURATION ENABLE is used to transition pass gate 706 into a conductive state during an FPGA configuration process. At the same time, signal ADDRESS may render pass gate 704 conductive, if memory cell 708 is being programmed. If so, then both pass gates 704 and 706 are conductive during configuration of memory cell 708, such that signal DATA BIT Ai is passed into latch 708 for storage.

Once the configuration process is complete, signal CONFIGURATION ENABLE is deasserted, which renders pass gate 706 non-conductive. In this instance, signal ADDRESS/SELECT Ci doubles as the selection control for multiplexer 712. If signal ADDRESS/SELECT Ci is at a logic low level, for example, then the logic value of memory cell A (from latch 708) is selected for the output of multiplexer 712. If, on the other hand, signal ADDRESS/SELECT Ci is at a logic high level, then the logic value of memory cell C 710 is selected for the output of multiplexer 712.

It should be noted, that the alternative memory cell configuration of FIG. 7 as discussed in relation to memory cell A 402 of FIG. 4 is also used to implement memory cells B 404 and C 406 as well. As such, the memory cell of FIG. 7 is instantiated for each memory cell that is used in a multiple context mode of operation. Thus, in one embodiment, three memory cells as exemplified in FIG. 4 constitutes an implementation where a triple context mode of operation is desired.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A multiple context memory cell configuration, comprising:
    a first pass gate coupled to receive a first data bit and adapted to pass the first data bit in response to a first address signal;
    a second pass gate coupled to receive the first data bit from the first pass gate and adapted to pass the first data bit in response to a configuration enable signal;
    a first latch coupled to receive the first data bit from the second pass gate and adapted to store the first data bit; and
    a first multiplexer coupled to the first latch and adapted to provide the first data bit as a first output of the multiple context memory cell configuration in response to a first level of the first address signal and adapted to provide a second data bit as the first output of the multiple context memory cell configuration in response to a second level of the first address signal.

2. The multiple context memory cell configuration of claim 1, wherein the second data bit is provided by a first adjacent memory cell.

3. The multiple context memory cell configuration of claim 2, wherein the first adjacent memory cell comprises:
    a third pass gate coupled to receive the second data bit and adapted to pass the second data bit in response to a second address signal;
    a fourth pass gate coupled to receive the second data bit from the third pass gate and adapted to pass the second data bit in response to the configuration enable signal;
    a second latch coupled to receive the second data bit from the fourth pass gate and adapted to store the second data bit; and
    a second multiplexer coupled to the second latch and adapted to provide the second data bit as a second output of the multiple context memory cell configuration in response to a first level of the second address signal and adapted to provide a third data bit as the second output of the multiple context memory cell configuration in response to a second level of the second address signal.

4. The multiple context memory cell configuration of claim 3, wherein the third data bit is provided by a second adjacent memory cell.

5. The multiple context memory cell configuration of claim 4, wherein the second adjacent memory cell comprises:
    a fifth pass gate coupled to receive the third data bit and adapted to pass the third data bit in response to a third address signal;
    a sixth pass gate coupled to receive the third data bit from the fifth pass gate and adapted to pass the third data bit in response to the configuration enable signal;
    a third latch coupled to receive the third data bit from the sixth pass gate and adapted to store the third data bit; and
    a third multiplexer coupled to the third latch and adapted to provide the third data bit as a third output of the multiple context memory cell configuration in response to a first level of the third address signal and adapted to provide the first data bit as the third output of the multiple context memory cell configuration in response to a second level of the third address signal.

6. A method of implementing a multiple context addressing scheme within a programmable logic device (PLD), the method comprising:
    allocating multiple context definitions within a configuration array;
    assigning a data line to each bit of each context definition;
    programming a data value for each bit of each context definition by using the assigned data line for each bit programmed; and
    selecting one of the context definitions to define a logic function within the PLD in response to a configuration select signal, wherein the configuration select signal utilizes the assigned data line.

7. The method of claim 6, wherein allocating multiple context definitions comprises allocating individual memory blocks within the configuration array, each individual memory block being adapted to store one context definition.

8. The method of claim 7, wherein allocating individual memory blocks comprises assigning a portion of each individual memory block to share one data word within the configuration array.

9. The method of claim 6, wherein selecting one of the context definitions comprises selecting a first context definition, the method further comprising,
    multiplexing between a bit of a first context definition and a bit of a second context definition, wherein multiplexer selection is provided by the assigned data line for the second context definition.

10. The method of claim 9, wherein selecting one of the context definitions comprises selecting a second context definition, the method further comprising, multiplexing between a bit of a third context definition and the bit of the first context definition, wherein multiplexer selection is provided by the assigned data line for the first context definition.

11. The method of claim 10, wherein selecting one of the context definitions comprises selecting a third context definition, the method further comprising, multiplexing between the bit of the second context definition and the bit of the third context definition, wherein multiplexer selection is provided by the assigned data line for the third context definition.

12. The method of claim 11, wherein selecting one of the context definitions further comprises taking a majority vote between the multiplexed outputs selected by the first, second, and third assigned data lines.

13. A method of implementing a multiple context addressing scheme within a programmable logic device (PLD), the method comprising:

allocating multiple context definitions within a configuration array;

assigning an address line to each memory cell of each context definition;

programming a data value for each memory cell by activating the memory cell using the address line; and selecting one of the multiple context definitions to define a logic function within the PLD in response to a configuration select signal, wherein the configuration select signal utilizes the assigned address line.

14. The method of claim 13, wherein allocating multiple context definitions comprises allocating individual memory blocks within the configuration array, each individual memory block being adapted to store one context definition.

15. The method of claim 14, wherein allocating individual memory blocks comprises assigning a portion of each individual memory block to be addressed by a unique data word within the configuration array.

16. The method of claim 13, wherein activating the memory cell comprises establishing a conduction state of a first pass gate using the address line assigned to the memory cell.

17. The method of claim 16, wherein activating the memory cell further comprises establishing a conduction state of a second pass gate using a global configuration enable signal.

18. The method of claim 13, wherein selecting one of the multiple context definitions comprises selecting a first context definition, the method further comprising:

multiplexing between a memory cell of a first context and a memory cell of a second context, wherein deasserting an address line assigned to the memory cell of the second context selects the memory cell of the first context; and multiplexing between a memory cell of a third context and the memory cell of the first context, wherein asserting an address line assigned to the memory cell of the first context selects the memory cell of the first context.

19. The method of claim 18, wherein selecting one of the multiple context definitions further comprises selecting a second context definition, the method further comprising:

multiplexing between the memory cell of the third context and the memory cell of the first context, wherein deasserting the address line assigned to the memory cell of the first context selects the memory cell of the third context; and multiplexing between the memory cell of the second context and the memory cell of the third context, wherein asserting an address line assigned to the memory cell of the third context selects the memory cell of the third context.

20. The method of claim 19, wherein selecting one of the multiple context definitions further comprises selecting a third context definition, the method further comprising:

multiplexing between the memory cell of the second context and the memory cell of the third context, wherein deasserting the address line assigned to the memory cell of the third context selects the memory cell of the second context; and multiplexing between the memory cell of the first context and the memory cell of the second context, wherein asserting the address line assigned to the memory cell of the second context selects the memory cell of the second context.

* * * * *